(12) United States Patent
Kudo et al.

(10) Patent No.: US 7,498,905 B2
(45) Date of Patent: Mar. 3, 2009

(54) SAW FILTER AND METHOD OF MANUFACTURING THE SAME

(75) Inventors: Takuo Kudo, Fukushima-ken (JP); Satoshi Waga, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 522 days.

(21) Appl. No.: 11/204,119

(22) Filed: Aug. 15, 2005

(65) Prior Publication Data

US 2006/0038637 A1  Feb. 23, 2006

(30) Foreign Application Priority Data

Aug. 20, 2004 (JP) .............................. 2004-240985

(51) Int. Cl.
*H03H 9/64* (2006.01)
(52) U.S. Cl. ....................... 333/193; 333/195
(58) Field of Classification Search ................. 333/193, 333/195
See application file for complete search history.

(56) References Cited

U.S. PATENT DOCUMENTS 5,325,573 A * 7/1994 Miyashita et al. .......... 29/25.35

2001/0029650 A1 10/2001 Takata

FOREIGN PATENT DOCUMENTS

| EP | 1387488 | 4/2004 |
|---|---|---|
| EP | 1414151 | 4/2004 |
| JP | 1103010 | 4/1989 |
| JP | 6177690 | 6/1994 |
| JP | 2000013165 | 1/2000 |
| JP | 20010308670 | 11/2001 |
| JP | 2002-374137 | 12/2002 |

* cited by examiner

*Primary Examiner*—Benny Lee
*Assistant Examiner*—Alan Wong
(74) *Attorney, Agent, or Firm*—Brinks Hofer Gilson & Lione

(57) ABSTRACT

In an SAW filter on one side of a piezoelectric substrate are formed a pattern portion constituted by a conductor and provided on the outer circumferential portion of the surface acoustic wave device, and a conductor removing portion formed between the surface acoustic wave device and the pattern portion. The shape of the surface acoustic wave device is formed by the conductor removing portion and the surface acoustic wave device remains non-conductive with the pattern by the conductor removing portion.

7 Claims, 7 Drawing Sheets

SAW FILTER AND METHOD OF MANUFACTURING THE SAME

This application claims the benefit of priority to Japanese Patent Application No. 2004-240985 filed on Aug. 20, 2004, herein incorporated by reference.

BACKGROUND OF THE INVENTION

1. Field of the Invention

The present invention relates to a SAW filter adapted to a communication apparatus and the like, and to a method of manufacturing the same.

2. Description of the Related Art

Referring to figures illustrating a surface acoustic wave device for use in a conventional SAW filter and a method of manufacturing the same, FIG. 10 is a plan view illustrating a state where a conventional surface acoustic wave device is formed on a piezoelectric substrate, FIG. 11 is an explanatory diagram illustrating a first process according to a method of manufacturing the conventional surface acoustic wave device, and FIG. 12 is an explanatory diagram illustrating a second process according to the method of manufacturing the conventional surface acoustic wave device.

Next, configuration of the conventional surface acoustic wave device will be described with reference to FIG. 10. On one side of a piezoelectric substrate 51 are provided one surface acoustic wave device 52 constituted by a conductor and a pair of reflectors 53 disposed at both sides of the surface acoustic wave device 52 and constituted by a conductor.

In addition, the surface acoustic wave device 52 includes a pair of opposite interdigitated electrodes 52a and 52b and connecting electrodes 52c and 52d connected to the pair of interdigitated electrodes 52a and 52b. In addition, on the one side of a piezoelectric substrate 51 are provided a conductor removing part 54a at most of the places except for the surface acoustic wave device 52 and the reflector 53 and an interelectrode removing part 54b with no conductor between the pair of interdigitated electrodes 52a and 52b (for example, see Japanese Unexamined Patent Application Publication No. 2002-374137).

In this manner, however, in the conventional SAW filter, since the conductor removing part 54a is provided at most of the places of the piezoelectric substrate 51 except for the surface acoustic wave device 52 and the reflector 53, it is a difficult process with low productivity and increased costs to provide the conductor removing part 54a.

Next, a manufacturing method of the conventional SAW filter will be described with reference to FIGS. 10 to 12. First, the piezoelectric substrate 51 having a conductor pattern 54 formed on the entire of the one side of the piezoelectric substrate 51 is prepared, and then, as shown in FIG. 11, the pair of interdigitated electrodes 52a and 52b made when the inter-electrode removing portion 54b is provided and the pair of reflectors 53 are formed by a photolithography process.

At this time, since the pair of interdigitated electrodes 52a and 52b and the pair of reflectors 53 are connected to the conductor pattern 54 to prevent pyroelectric breakdown and thus have the same potential as the conductor pattern 54, no pyroelectric breakdown occurs when the photolithography process is performed.

Next, as shown in FIG. 12, the connecting electrodes 52c and 52d connected to the pair of interdigitated electrodes 52a and 52b are formed on the conductor pattern 54. However, similarly, since the pair of interdigitated electrodes 52a and 52b have the same potential as the conductor pattern 54, no pyroelectric breakdown occurs when the photolithography process is performed.

Thereafter, as shown in FIG. 10, the SAW filter is completed by forming the conductor removing part 54a by a photolithography process in the conductor pattern 54 at a place except for the surface acoustic wave device 52 and the reflectors 53 (for example, see Japanese Unexamined Patent Application Publication No. 2002-374137).

However, in the conventional method of manufacturing the conventional SAW filter, since the conductor removing part 54a for removing the conductor pattern 54 is provided at most of the places of the piezoelectric substrate 51 except for the surface acoustic wave device 52 and the reflectors 53, it is a difficult process with low productivity and increased costs to provide the conductor removing part 54a.

As described above, in the conventional SAW filter and the method of manufacturing the same, since the conductor removing part 54a for removing the conductor pattern 54 is provided at most of the places of the piezoelectric substrate 51 except for the surface acoustic wave device 52 and the reflectors 53, it is a difficult process with low productivity and increased costs to provide the conductor removing part 54a.

SUMMARY OF THE INVENTION

The invention has been finalized in view of the inherent drawbacks in the conventional SAW filter and the method of manufacturing the same, and it is an object of the invention to provide a SAW filter with high productivity and decreased costs, and a method of manufacturing the same.

According to a first aspect of the invention, there is provided a SAW filter including a piezoelectric substrate, and a plurality of surface acoustic wave devices formed on one side of the piezoelectric substrate, each including a pair of opposite interdigitated electrodes formed by conductors and connecting electrodes formed by conductors and connected respectively to the interdigitated electrodes. Pattern portions formed by conductors provided on the circumferences of the plurality of surface acoustic wave devices and conductor removing portions provided between the surface acoustic wave devices and the pattern portions are formed on the one side of the piezoelectric substrate, and the shape of the surface acoustic wave devices is formed by the conductor removing portions, and the surface acoustic wave devices remain non-conductive with the pattern portions by the conductor removing portions.

According to a second aspect of the invention, preferably, the conductor removing portions are formed by narrow conductor grooves, and the pattern portions are formed on the rough entire surface of the one side of the piezoelectric substrate except for the surface acoustic wave devices and the conductor removing portions.

According to a third aspect of the invention, preferably, each of the conductor removing portions includes a shape removing portion for forming the shape of the surface acoustic wave devices and a lateral removing portion connected to the shape removing portion from the periphery including boundaries between the interdigitated electrodes and the connecting electrodes at both ends of one of the surface acoustic wave devices, the lateral removing portion extending toward a side edge of the piezoelectric substrate, and the pattern portion located at both sides of the surface acoustic wave device is separated into two portions by the lateral removing portion.

According to a fourth aspect of the invention, preferably, the SAW filter is composed of a ladder filter in which the plurality of surface acoustic wave devices is connected in series to one another and a plurality of other surface acoustic wave devices is connected in parallel with respect to the plurality of surface acoustic wave devices connected in series, and the lateral removing portion is provided at both ends of at least one of the plurality of surface acoustic wave devices connected in series.

According to a fifth aspect of the invention, preferably, two of the surface acoustic wave devices are arranged adjacent and opposite to each other, the interdigitated electrodes of one of the two surface acoustic wave devices are connected to each other by the connecting electrodes, each of the conductor removing portions includes a shape removing portion for forming the shape of the surface acoustic wave devices and four lateral removing portions connected to the shape removing portion from the periphery including boundaries between interdigitated electrodes, which are not connected to each other, of the other of the two surface acoustic wave devices and the connecting electrodes connected to the interdigitated electrodes which are not connected to each other, at both ends of the two surface acoustic wave devices, the four lateral removing portions extending toward a side edge of the piezoelectric substrate, and each of the pattern portions located at both sides of the surface acoustic wave device is separated into three portions by the lateral removing portion.

According to a sixth aspect of the invention, preferably, two of the surface acoustic wave devices are arranged adjacent and opposite to each other, the interdigitated electrodes of one of the two surface acoustic wave devices are connected to each other by the connecting electrodes, each of the conductor removing portions includes a shape removing portion for forming the shape of the surface acoustic wave devices and a lateral removing portion connected to the shape removing portion from the periphery including boundaries between the interdigitated electrodes and the connecting electrodes, at both ends of the two surface acoustic wave devices, the lateral removing portion extending toward a side edge of the piezoelectric substrate, and the pattern portion located at both sides of the surface acoustic wave device is separated into two portions by the lateral removing portion.

According to a seventh aspect of the invention, preferably, the lateral removing portion connected to the shape removing portion from the periphery including boundaries between interdigitated electrodes, which are not connected to each other, of the other of the two surface acoustic wave devices and the connecting electrodes connected to the interdigitated electrodes which are not connected to each other, the lateral removing portion extending toward a side edge of the piezoelectric substrate, is provided at both, any, or one end of the two surface acoustic wave devices, and the pattern portion located at both sides of the surface acoustic wave device is separated into three or four portions by the lateral removing portion.

According to an eighth aspect of the invention, preferably, the lateral removing portion includes an extending projection removing portion connected to the shape removing portion, which does not reach the side edge of the piezoelectric substrate, and an end edge removing portion formed by removing the pattern portion located between an end of the extending projection removing portion and the end edge of the piezoelectric substrate to have a width narrower than the extending projection removing portion.

According to a ninth aspect of the invention, preferably, the shape removing portion includes main removing portions formed with a predetermined gap on the rough entire of the shape of the surface acoustic wave device, first connecting removing portions located between the main removing portions and having connecting portions connecting the pattern portion to the connecting electrodes or the pattern portion to the interdigitated electrodes, with the connecting portions narrower than the main removing portions, and second connecting removing portions located between ends of the main removing portions and the side edge of the piezoelectric substrate and having connecting portions connecting the pattern portion to the connecting electrodes, with the connecting portions narrower than the main removing portions.

According to a tenth aspect of the invention, preferably, a reflector is provided in the pattern portion arranged at both sides of each of the surface acoustic wave devices.

According to an eleventh aspect of the invention, there is provided a method of manufacturing a SAW filter according to the first solution, including the surface acoustic wave device and the piezoelectric substrate having a conductor pattern for forming the pattern portion. In order to form the rough entire shape of the surface acoustic wave device, the method includes forming a main removing portion serving as a removing portion of the conductor pattern formed between the surface acoustic wave device and the pattern portion, with the surface acoustic wave device connected to the pattern portion by a connecting portion formed by a portion of the conductor pattern; forming a connecting removing portion in which the connecting portion is removed; and forming a conductor removing portion by the main removing portion and the connecting removing portion. In the method, the surface acoustic wave device remains non-conductive with the pattern portion by the conductor removing portion.

According to a twelfth aspect of the invention, preferably, the connecting removing portion is narrower than the main removing portion.

According to a thirteenth aspect of the invention, preferably, the conductor removing portion includes, at the both sides of one of the surface acoustic wave devices, an extending projection removing portion connected to the main removing portion from the periphery including boundaries between the interdigitated electrodes and the connecting electrodes, which does not reach the edge of the piezoelectric substrate, and an end edge removing portion formed by removing the pattern portion located between an end of the extending projection removing portion and a side edge of the piezoelectric substrate, and the extending projection removing portion is formed by the same process as the main removing portion, the end edge removing portion is formed by the same process as the connecting removing portion, and the pattern portion located at the both sides of the surface acoustic wave device is separated into two pattern portions.

According to a fourteenth aspect of the invention, preferably, the SAW filter includes a large piezoelectric substrate on which a plurality of piezoelectric substrates is formed and a plurality of conductor patterns for forming the surface acoustic wave devices and the pattern portions arranged corresponding to the piezoelectric substrates on the large piezoelectric substrate, and adjacent conductor patterns are connected to each other by a connecting conductor.

According to a fifteenth aspect of the invention, preferably, the surface acoustic wave devices and the pattern portions are formed by the same process in the plurality of conductor patterns formed on the large piezoelectric substrate.

Since the SAW filter of the invention comprises a piezoelectric substrate and a plurality of surface acoustic wave devices formed on one side of the piezoelectric substrate, each including a pair of opposite interdigitated electrodes formed by conductors and connecting electrodes formed by conductors and connected respectively to the interdigitated electrodes, pattern portions formed by conductors provided on the circumferences of the plurality of surface acoustic wave devices and conductor removing portions provided between the surface acoustic wave devices and the pattern portions are formed on the one side of the piezoelectric substrate, and the shape of the surface acoustic wave devices is formed by the conductor removing portions, and the surface acoustic wave devices remain non-conductive with the pattern portions by the conductor removing portions, the pattern portion serving to prevent pyroelectric breakdown remains when the SAW filter is manufactured, and removal of the pattern portion is unnecessary, thus obtaining a SAW filter with high productivity and low costs as compared to the conventional techniques.

In addition, since the conductor removing portions are formed by narrow conductor grooves, and the pattern portions are formed on the rough entire surface of the one side of the piezoelectric substrate except for the surface acoustic wave devices and the conductor removing portions, the area of the conductor removing portion is small, the conductor removing portion can be easily and quickly formed, thus realizing SAW filters with high productivity.

In addition, since each of the conductor removing portions includes a shape removing portion for forming the shape of the surface acoustic wave devices and a lateral removing portion connected to the shape removing portion from the periphery including boundaries between the interdigitated electrodes and the connecting electrodes at both ends of one of the surface acoustic wave devices, the lateral removing portion extending toward a side edge of the piezoelectric substrate, and the pattern portion located at both sides of the surface acoustic wave device is separated into two portions by the lateral removing portion, signals leaked into the pattern portion are reduced by the lateral removing portion, thus obtaining strong isolation.

In addition, since the SAW filter is composed of a ladder filter in which the plurality of surface acoustic wave devices is connected in series to one another and a plurality of other surface acoustic wave devices is connected in parallel with respect to the plurality of surface acoustic wave devices connected in series, and the lateral removing portion is provided at both ends of at least one of the plurality of surface acoustic wave devices connected in series, signals leaked into the pattern portion are reduced by the lateral removing portion, thus obtaining strong isolation.

In addition, since two of the surface acoustic wave devices are arranged adjacent and opposite to each other, the interdigitated electrodes of one of the two surface acoustic wave devices are connected to each other by the connecting electrodes, each of the conductor removing portions includes a shape removing portion for forming the shape of the surface acoustic wave devices and four lateral removing portions connected to the shape removing portion from the periphery including boundaries between interdigitated electrodes, which are not connected to each other, of the other of the two surface acoustic wave devices and the connecting electrodes connected to the interdigitated electrodes which are not connected to each other, at both ends of the two surface acoustic wave devices, the four lateral removing portions extending toward a side edge of the piezoelectric substrate, and each of the pattern portions located at both sides of the surface acoustic wave device is separated into three portions by the lateral removing portion, signals leaked into the pattern portion are reduced by the lateral removing portion in one of the surface acoustic wave devices, thus obtaining higher isolation.

In addition, since two of the surface acoustic wave devices are arranged adjacent and opposite to each other, the interdigitated electrodes of one of the two surface acoustic wave devices are connected to each other by the connecting electrodes, each of the conductor removing portions includes a shape removing portion for forming the shape of the surface acoustic wave devices and a lateral removing portion connected to the shape removing portion from the periphery including boundaries between the interdigitated electrodes and the connecting electrodes, at both ends of the two surface acoustic wave devices, the lateral removing portion extending toward a side edge of the piezoelectric substrate, and the pattern portion located at both sides of the surface acoustic wave device is separated into two portions by the lateral removing portion, the lateral removing portion can be easily formed and signals leaked into the pattern portion are reduced by the lateral removing portion, thus obtaining strong isolation.

In addition, since the lateral removing portion connected to the shape removing portion from the periphery including boundaries between interdigitated electrodes, which are not connected to each other, of the other of the two surface acoustic wave devices and the connecting electrodes connected to the interdigitated electrodes which are not connected to each other, the lateral removing portion extending toward a side edge of the piezoelectric substrate, is provided at both, any, or one end of the two surface acoustic wave devices, and the pattern portion located at both sides of the surface acoustic wave device is separated into three or four portions by the lateral removing portion, signals leaked into the pattern portion are reduced by two or three lateral removing portions in one of each of the surface acoustic wave devices, thus obtaining further higher isolation.

In addition, since the lateral removing portion includes an extending projection removing portion connected to the shape removing portion, which does not reach the side edge of the piezoelectric substrate, and an end edge removing portion formed by removing the pattern portion located between an end of the extending projection removing portion and the end edge of the piezoelectric substrate to have a width narrower than the extending projection removing portion, the end edge removing portion can be easily and quickly formed, thus realizing SAW filters with high productivity.

In addition, since the shape removing portion includes main removing portions formed with a predetermined gap on the rough entire of the shape of the surface acoustic wave device, first connecting removing portions located between the main removing portions and having connecting portions connecting the pattern portion to the connecting electrodes or the pattern portion to the interdigitated electrodes, with the connecting portions narrower than the main removing portions, and second connecting removing portions located between ends of the main removing portions and the side edge of the piezoelectric substrate and having connecting portions connecting the pattern portion to the connecting electrodes, with the connecting portions narrower than the main removing portions, the first and second connecting portions can be easily formed and a fast work can be achieved, thus obtaining a SAW filter with high productivity.

In addition, since a reflector is provided in the pattern portion arranged at both sides of each of the surface acoustic wave devices, a portion of the pattern portion can be used as the reflector. Also, since the reflector is connected to the pattern portion serving to prevent pyroelectric breakdown when the SAW filter is manufactured, no pyroelectric breakdown occurs.

In addition, there is provided a method of manufacturing a SAW filter including the surface acoustic wave device and the piezoelectric substrate having a conductor pattern for forming the pattern portion. In order to form the rough entire shape of the surface acoustic wave device, the method includes forming a main removing portion serving as a removing portion of the conductor pattern formed between the surface acoustic wave device and the pattern portion, with the surface acoustic wave device connected to the pattern portion by a connecting portion formed by a portion of the conductor pattern; forming a connecting removing portion in which the connecting portion is removed; and forming a conductor removing portion by the main removing portion and the connecting removing portion. In the method, the surface acoustic wave device remains non-conductive with the pattern portion by the conductor removing portion.

That is, since the main removing portion is formed with the surface acoustic wave device connected to the pattern portion by the connecting portion, no pyroelectric breakdown occurs. Also, since the pattern portion remains after the main removing portion is formed, an inexpensive connecting removing portion can be easily and quickly formed, thus realizing a SAW filter with high productivity as compared to the conventional techniques.

In addition, since the connecting removing portion is narrower than the main removing portion, an area of the connecting removing portion is small and can be quickly formed, thus realizing a SAW filter with high productivity.

In addition, since the conductor removing portion includes, at the both sides of one of the surface acoustic wave devices, an extending projection removing portion connected to the main removing portion from the periphery including boundaries between the interdigitated electrodes and the connecting electrodes, which does not reach the edge of the piezoelectric substrate, and an end edge removing portion formed by removing the pattern portion located between an end of the extending projection removing portion and a side edge of the piezoelectric substrate, and the extending projection removing portion is formed by the same process as the main removing portion, the end edge removing portion is formed by the same process as the connecting removing portion, and the pattern portion located at the both sides of the surface acoustic wave device is separated into two pattern portions, the SAW filters can be easily manufactured with high productivity.

In addition, since the SAW filter includes a large piezoelectric substrate on which a plurality of piezoelectric substrates is formed and a plurality of conductor patterns for forming the surface acoustic wave devices and the pattern portions arranged corresponding to the piezoelectric substrates on the large piezoelectric substrate, and adjacent conductor patterns are connected to each other by a connecting conductor, a plurality of SAW filters can be simultaneously manufactured with high productivity. Also, since the adjacent conductor patterns are connected to each other by the connecting conductor, no pyroelectric breakdown occurs.

Furthermore, since the surface acoustic wave devices and the pattern portions are formed by the same process in the plurality of conductor patterns formed on the large piezoelectric substrate, SAW filters can be obtained with high productivity and no pyroelectric breakdown occurs.

DESCRIPTION OF THE PREFERRED EMBODIMENT

Figure 1:
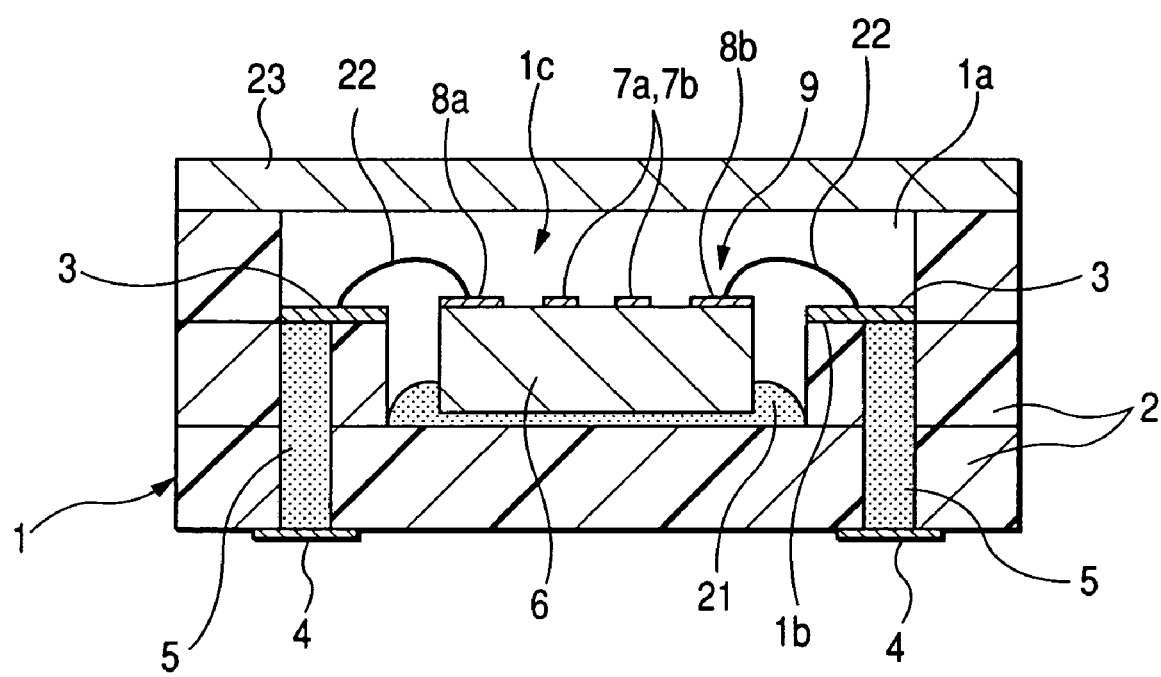
FIG. 1 is a sectional view illustrating a main portion of a SAW filter according to a first embodiment of the invention.
Figure 2:
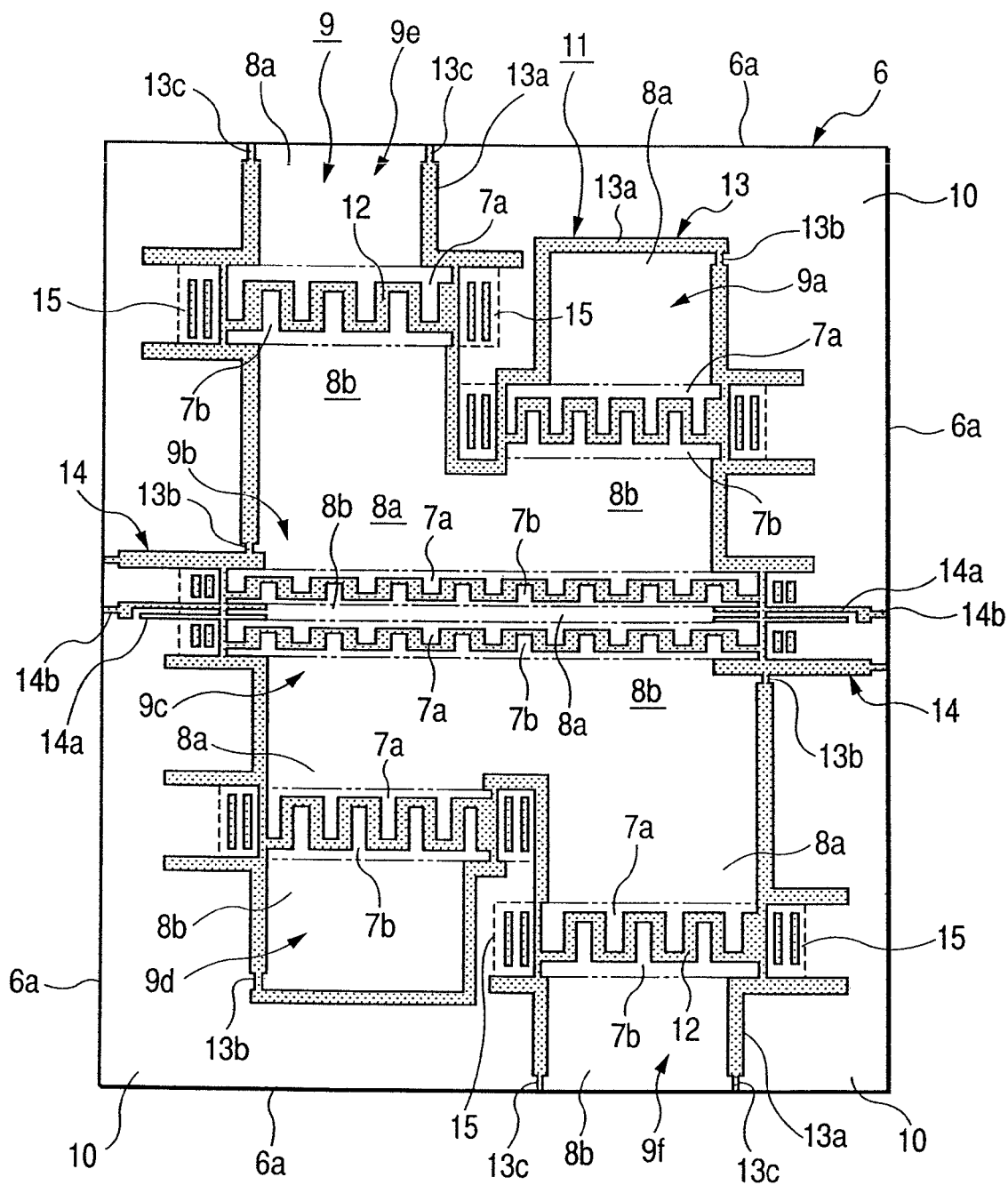
FIG. 2 is an expanded plan view showing a state where a plurality of surface acoustic wave device is formed on a piezoelectric substrate in the SAW filter according to the first embodiment of the invention.
Figure 3:
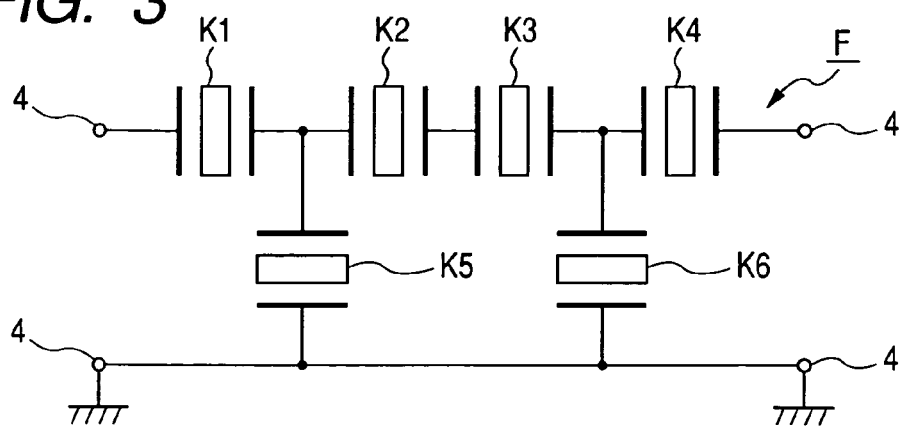
FIG. 3 is a first circuit diagram of the SAW filter of the invention.
Figure 4:
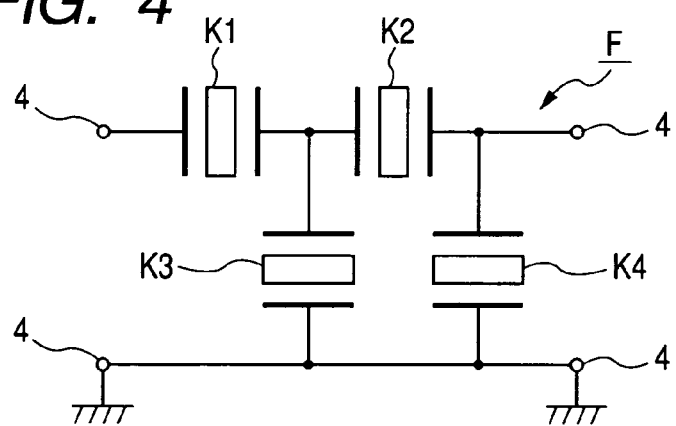
FIG. 4 is a second circuit diagram of the SAW filter of the invention.
Figure 5:
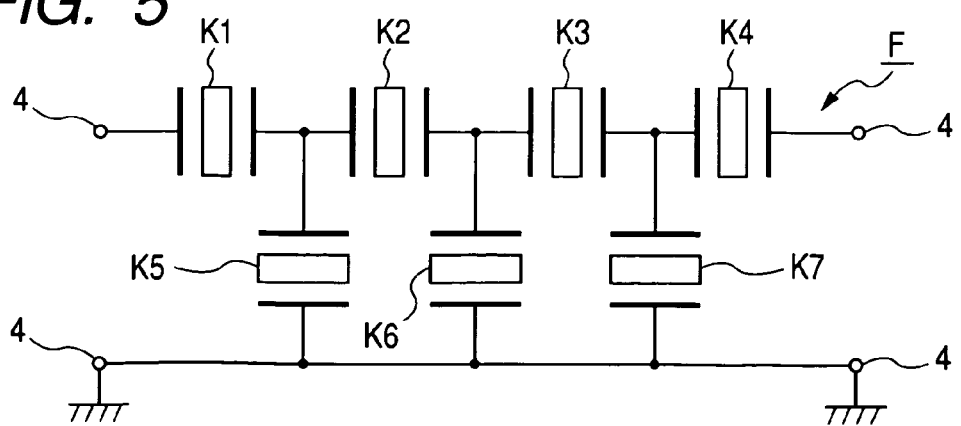
FIG. 5 is a third circuit diagram of the SAW filter of the invention.

A SAW filter and a method of manufacturing the same according to preferred embodiments of the invention will now be described with reference to the drawings. FIG. 1 is a sectional view illustrating a main portion of a SAW filter according to a first embodiment of the invention, FIG. 2 is an expanded plan view showing a state where a plurality of surface acoustic wave devices is formed on a piezoelectric substrate in the SAW filter according to the first embodiment of the invention, FIG. 3 is a first circuit diagram of the SAW filter of the invention, FIG. 4 is a second circuit diagram of the SAW filter of the invention, and FIG. 5 is a third circuit diagram of the SAW filter of the invention.

Figure 6:
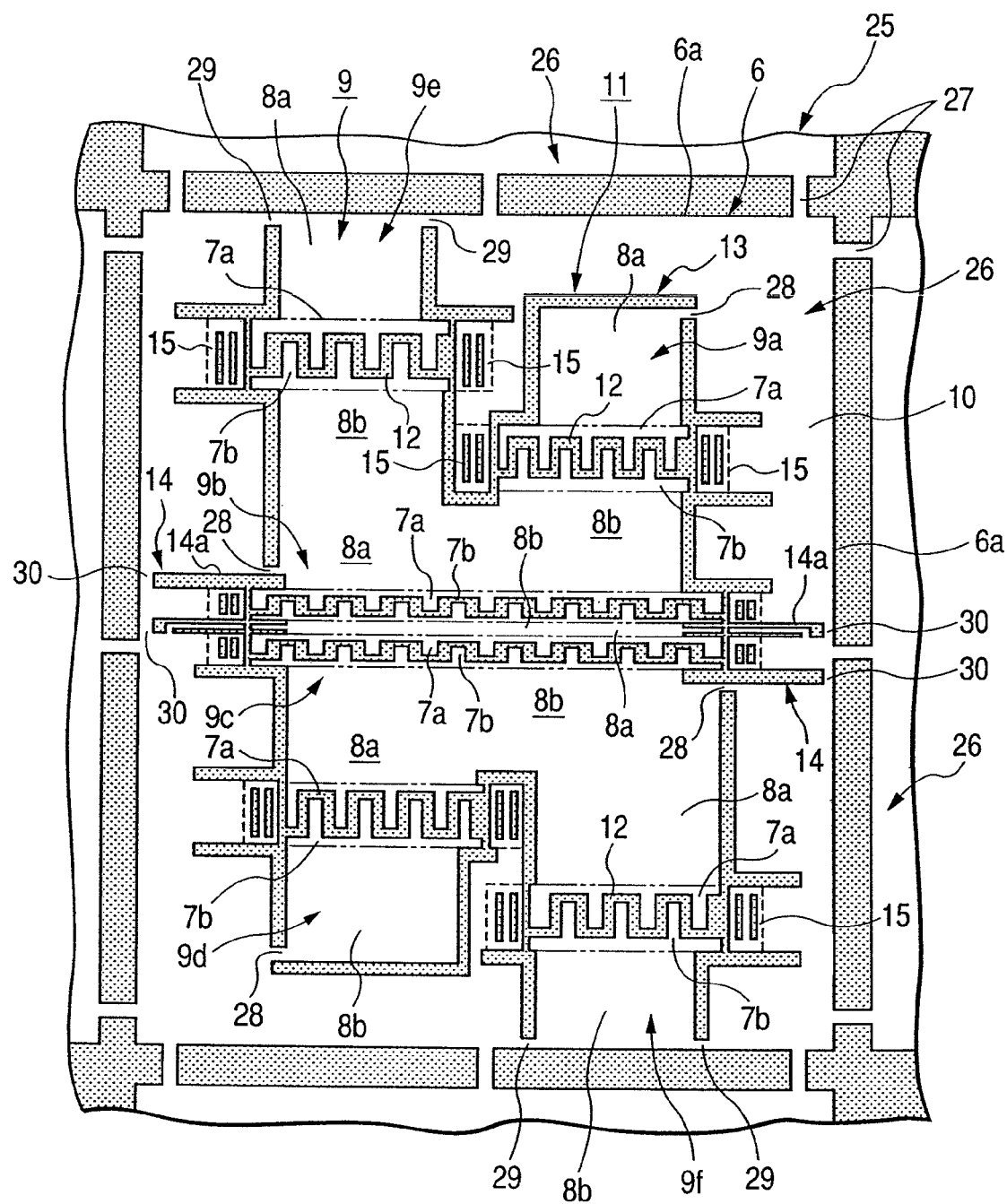
FIG. 6 is an explanatory diagram illustrating a first process of a method of manufacturing the SAW filter according to the first embodiment of the invention.
Figure 7:
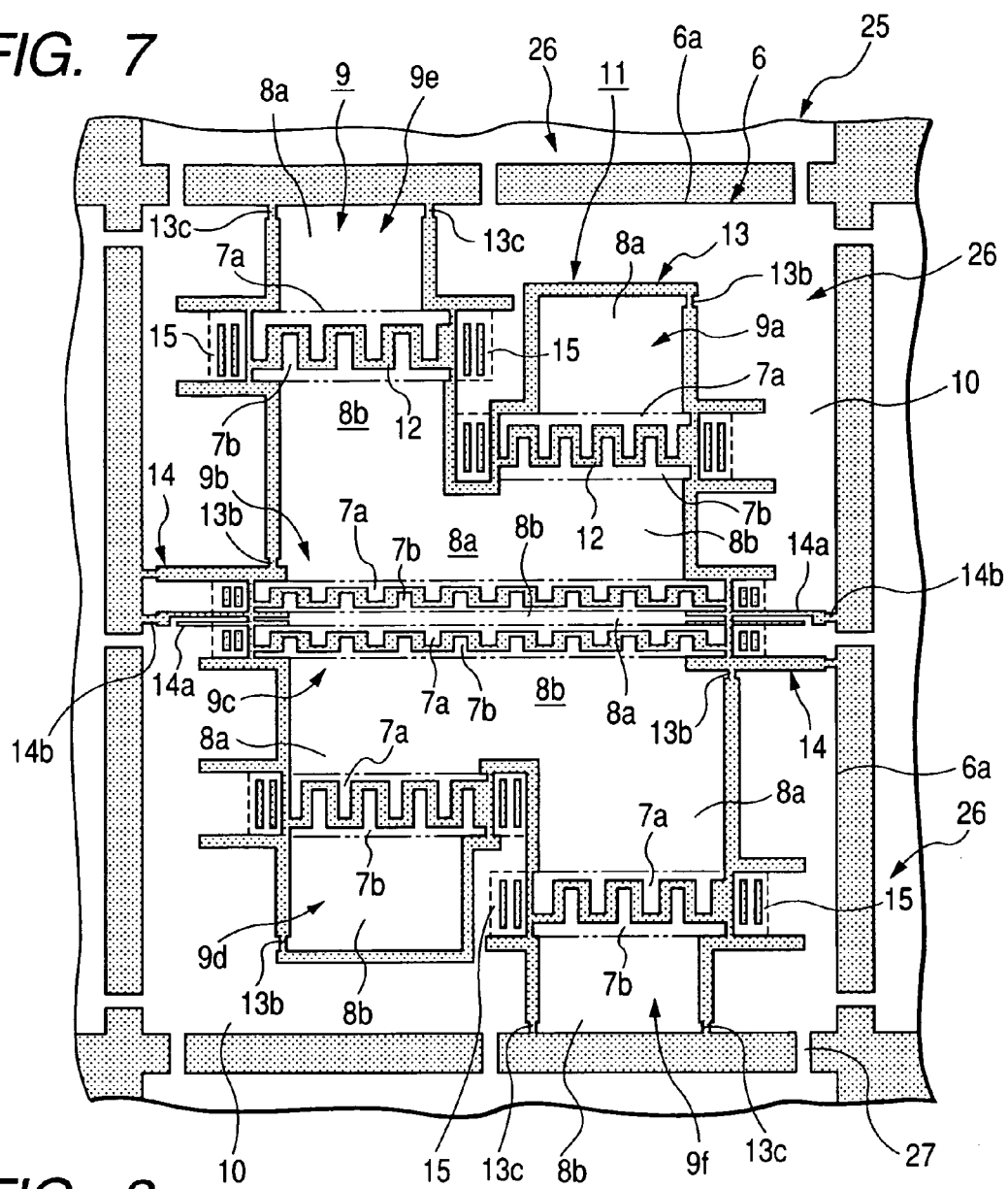
FIG. 7 is an explanatory diagram illustrating a second process of the method of manufacturing the SAW filter according to the first embodiment of the invention.
Figure 8:
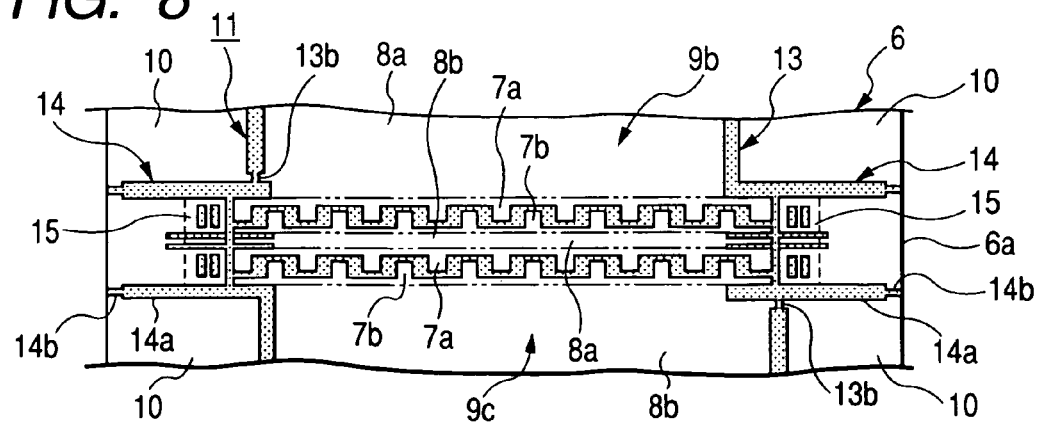
FIG. 8 is an expanded plan view showing a state where a plurality of surface acoustic wave devices is formed on a piezoelectric substrate in a SAW filter according to a second embodiment of the invention.
Figure 9:
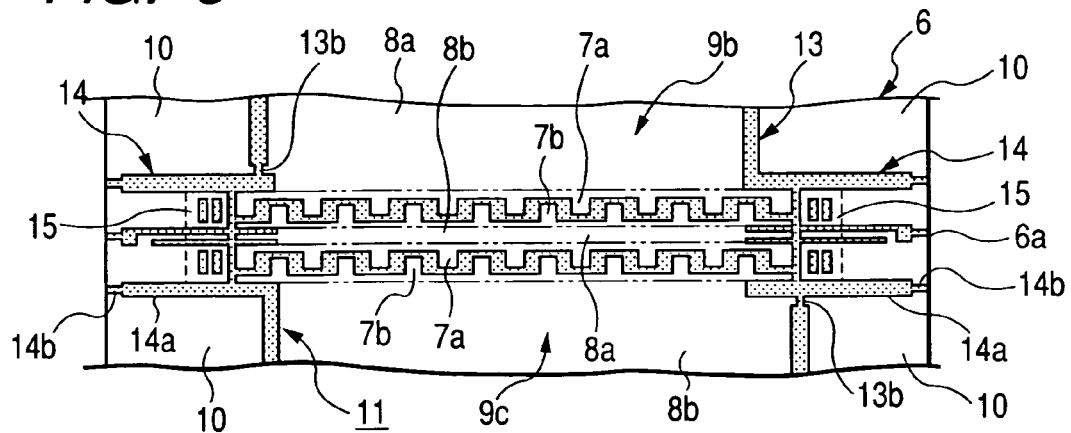
FIG. 9 is an expanded plan view showing a state where a plurality of surface acoustic wave devices is formed on a piezoelectric substrate in a SAW filter according to a third embodiment of the invention.
Figure 10:
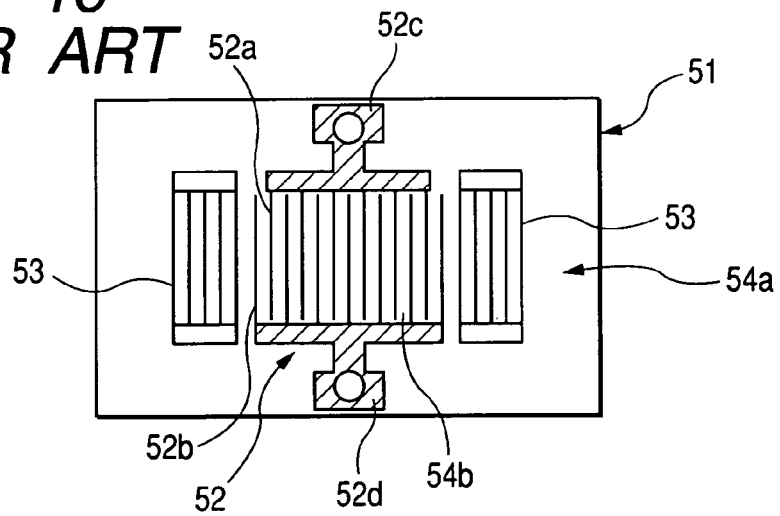
FIG. 10 is a plan view showing a state where a conventional surface acoustic wave device is formed on a piezoelectric substrate.
Figure 11:
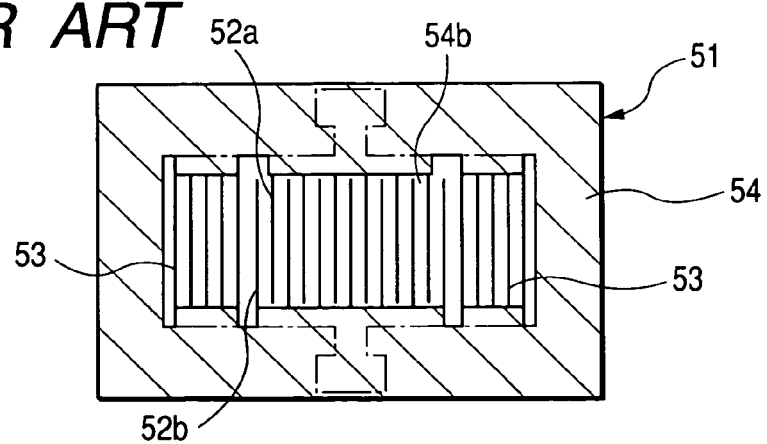
FIG. 11 is an explanatory diagram illustrating a first process of a method of manufacturing the conventional surface acoustic wave device.
Figure 12:
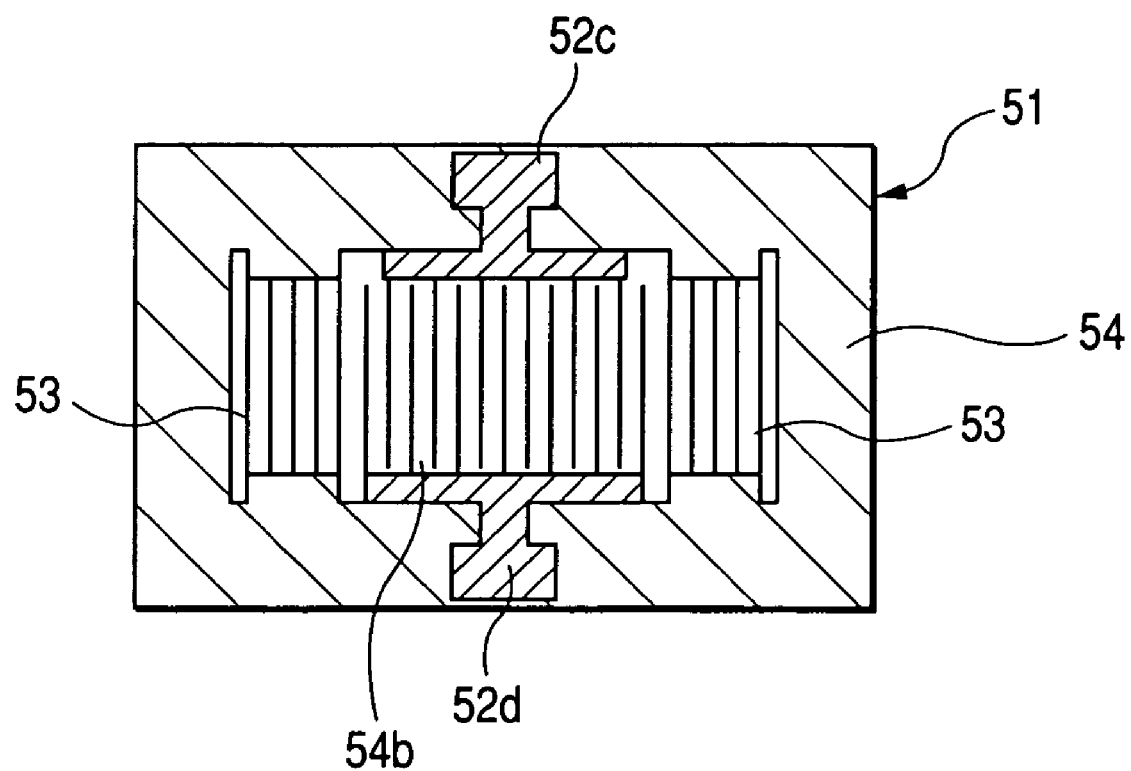
FIG. 12 is an explanatory diagram illustrating a second process of the method of manufacturing the conventional surface acoustic wave device.

In addition, FIG. 6 is an explanatory diagram illustrating a first process of a method of manufacturing the SAW filter according to the first embodiment of the invention, FIG. 7 is an explanatory diagram illustrating a second process of the method of manufacturing the SAW filter according to the first embodiment of the invention, FIG. 8 is an expanded plan view showing a state where a plurality of surface acoustic wave devices is formed on a piezoelectric substrate in the SAW filter according to a second embodiment of the invention, FIG. 9 is an expanded plan view showing a state where a plurality of surface acoustic wave devices is formed on a piezoelectric substrate in the SAW filter according to a third embodiment of the invention.

Now, the configuration of a SAW filter according to a first embodiment of the invention will be described. A laminated substrate 1 is formed by laminating a plurality of insulating substrates 2 including an alumina substrate or the like, and a receiving portion 1c having an opening 1a and a concave portion provided with a step 1b is formed on the laminated substrate 1.

A plurality of lands 3 is formed at the step 1b in the receiving portion 1c, a plurality of terminals 4 is provided at the bottom of the laminated substrate 1, and the terminals 4 are connected to the lands 3 by a plurality of connecting conductors 5 provided in the laminated substrate 1.

On one side of a rectangular plate-shaped piezoelectric substrate 6 are formed a plurality of surface acoustic wave devices 9 each having a pair of interdigitated electrodes 7a and 7b constituted by a conductor and arranged opposite to each other and a pair of connecting electrodes 8a and 8b connected to the pair of interdigitated electrodes 7a and 7b, respectively, a pattern portion 10 constituted by a conductor and provided on the outer circumferential portion of the surface acoustic wave device 9, and a conductor removing portion 11 having narrow conductor grooves formed between the surface acoustic wave device 9 and the pattern portion 10. The shape of the surface acoustic wave device 9 is formed by the conductor removing portion 11 and the surface acoustic wave device 9 remains non-conductive with the pattern 10 by the conductor removing portion 11.

In addition, the piezoelectric substrate 6 is received in the receiving portion 1c of the laminated substrate 1 in a state in which the surface acoustic wave device 9 turned upward, the bottom of the piezoelectric substrate 6 is adhered to the laminated substrate 1 in the receiving portion 1c by means of a thermosetting adhesive 21, and the connecting electrode 8a or 8b of the surface acoustic wave device 9 is bonded to the land 3 through bonding of a wire 22.

In addition, a cover 23 covers the top of the laminated substrate 1 to block the opening 1a under a state where inert gas is sealed within the receiving portion 1c to complete the SAW filter of the invention as shown in FIG. 1.

Next, a detailed configuration of the surface acoustic wave device 9 formed on the piezoelectric substrate 6 will be described with reference to FIG. 2. In this embodiment, the surface acoustic wave device 9 is composed of first to sixth surface acoustic wave devices 9a to 9f to form six resonators traversing a central portion of the piezoelectric substrate 6 in a longitudinal direction, forming a ladder SAW filter F.

That is, the connecting electrode 8b of the first surface acoustic wave device 9a is connected to the connecting electrode 8a of the second surface acoustic wave device 9b such that the first and second surface acoustic wave devices 9a and 9b are connected in series to each other. In addition, the second and third surface acoustic wave devices 9b and 9c are arranged in parallel and opposite to the third surface acoustic wave device 9c which is adjacent to the second surface acoustic wave device 9b and the connecting electrode 8b of the second surface acoustic wave device 9b is connected to the connecting electrode 8a of the third surface acoustic wave device 9c such that the second and third surface acoustic wave devices 9b and 9c are connected in series to each other. In addition, the connecting electrode 8b of the third surface acoustic wave device 9c is connected to the connecting electrode 8a of the fourth surface acoustic wave device 9d such that the third and fourth surface acoustic wave devices 9c and 9d are connected in series to each other.

In addition, the fifth surface acoustic wave device 9e is arranged near the first and second surface acoustic wave devices 9a and 9b and the connecting electrode 8b of the fifth surface acoustic wave device 9e is connected in parallel to the connecting electrode 8b of the first surface acoustic wave device 9a and the connecting electrode 8a of the second surface acoustic wave device 9b. In addition, the sixth surface acoustic wave device 9f is arranged near the third and fourth surface acoustic wave devices 9c and 9d and the connecting electrode 8a of the sixth surface acoustic wave device 9f is connected in parallel to the connecting electrode 8b of the third surface acoustic wave device 9c and the connecting electrode 8a of the fourth surface acoustic wave device 9d.

In addition, although not shown here, the connecting electrode 8a of the first surface acoustic wave device 9a is connected to one land 3 by the wire 22, and the connecting electrode 8b of the fourth surface acoustic wave device 9d is connected to one land 3 by the wire 22. Also, under the state where the connecting electrode 8a of the fifth surface acoustic wave device 9e is connected to the connecting electrode 8b of the sixth surface acoustic wave device 9f by the wire 22, the connecting electrode 8a of the fifth surface acoustic wave device 9e is connected to the one land 3 by the wire 22 and the connecting electrode 8b of the sixth surface acoustic wave device 9f is connected to the one land 3 by the wire 22.

As a result, as shown in the first circuit diagram of the ladder SAW filter F of FIG. 3, first to sixth resonators K1 to K6 are formed by the first to sixth surface acoustic wave devices 9a to 9f. Herein, the first to fourth resonators K1 to K4 are connected in series, the fifth resonator K5 is in parallel between the first and second resonators K1 and K2, the sixth resonator K6 is in parallel between the third and fourth resonators K3 and K4. Terminals 4 connected to the first and fifth resonators K1 and K5 are input terminals and terminals 4 connected to the fourth and sixth resonators K4 and K6 are output terminals.

Now, a detailed configuration of the pattern portion 10 and the conductor removing portion 11 will be described with reference to FIG. 2. The conductor removing portion 11 has an inter-electrode removing portion 12 provided between the pair of interdigitated electrodes 7a and 7b, and a shape removing portion 13 connected to the inter-electrode removing portion 12 for forming a shape of the surface acoustic wave device 9. The shape removing portion 13 has main removing portions 13a formed with a specified gap on the rough entire of the shape of the surface acoustic wave device 9, first connecting removing portions 13b located between the main removing portions 13a and having connecting portions 28 (described below) connecting the pattern portion 10 to the connecting electrodes 8a and 8b or the pattern portion 10 to the interdigitated electrodes 7a and 7b, with the connecting portions 28 narrower than the main removing portions 13a, and second connecting removing portions 13c located between ends of the main removing portions 13a and edges 6a of the piezoelectric substrate 6 and having connecting portions 29 (described below) connecting the pattern portion 10 to the connecting electrodes 8a and 8b, with the connecting portions 29 narrower than the main removing portions 13a.

In addition, the conductor removing portion 11 has lateral removing portions 14 connected to the shape removing portion 13 from the periphery including boundaries between the interdigitated electrodes 7a and 7b and the connecting electrodes 8a and 8b at both ends of the surface acoustic wave device 9 and extending toward the edge 6a of the piezoelectric substrate 6. The lateral removing portions 14 allow the pattern portion 10 to be separated into a plurality of portions located at both sides of the surface acoustic wave device 9.

More specifically, in this embodiment, in the second and third surface acoustic wave devices 9b and 9c, which are adjacent and opposite to each other, the conductor removing portions 13b and 13c each has one lateral removing portion 14 extending from the periphery including the boundary between the interdigitated electrode 7a and the connecting electrode 8a to the edge 6a of the piezoelectric substrate 6 at one end of the second surface acoustic wave device 9b, one lateral removing portion 14 extending from the periphery including the boundary between the interdigitated electrode 7b and the connecting electrode 8b to the edge 6a of the piezoelectric substrate 6 at the other end of the third surface acoustic wave device 9c, and two lateral removing portions 14 extending from the periphery including a boundary between the interdigitated electrode 7b and the connecting electrode 8b of the second surface acoustic wave device 9b and the periphery including a boundary between the interdigitated electrode 7a and the connecting electrode 8a of the third surface acoustic wave device 9c to the edge 6a of the piezoelectric substrate 6 at both ends between the second and third surface acoustic wave devices 9b and 9c. These lateral removing portions 14 allow the pattern portion 10 to be separated into three portions located at both sides of the surface acoustic wave device 9.

In addition, each of the lateral removing portions 14 is composed of an extending projection removing portion 14a connected to the shape removing portion 13 and not reaching the edge 6a of the piezoelectric substrate 6 and an end edge removing portion 14b having a connecting portion 30 (described below) of the pattern portion, located between an end of the extending projection removing portion 14a and the edge 6a of the piezoelectric substrate 6 and narrower than the extending projection removing portion 14a.

Finally, to complete the SAW filter of the invention, a reflector 15 for preventing leakage of signals is formed in the pattern portion 10 arranged at both sides of the surface acoustic wave device 9.

FIG. 4 shows a second circuit diagram of the SAW filter of the invention. A ladder SAW filter F shown in the second circuit diagram is constituted by first to fourth resonators K1 to K4 each formed by the surface acoustic wave device 9. In the shown ladder SAW filter F, the third and fourth resonators K3 and K4 are connected in parallel with respect to the first and second resonators K1 and K2 connected in series to each other. It is to be understood that the principle of the SAW filter of the invention is applicable to the SAW filter shown in FIG. 4.

FIG. 5 shows a third circuit diagram of the SAW filter of the invention. A ladder SAW filter F shown in the third circuit diagram is constituted by first to seventh resonators K1 to K7 each formed by the surface acoustic wave device 9. In the shown ladder SAW filter F, the fifth and seventh resonators K5 to K7 are connected in parallel with respect to the first to fourth resonators K1 and K2 connected in series to each other. It is to be understood that the principle of the SAW filter of the invention is applicable to the SAW filter shown in FIG. 5.

In addition, it is to be understood that the principle of the SAW filter of the invention is applicable to ladder SAW filters other than the ladder SAW filters shown in FIGS. 3 to 5.

Next, a method of manufacturing the SAW filter of the invention will be described with reference to FIGS. 6 and 7. First, a large piezoelectric substrate 25 on which a plurality of piezoelectric substrates 6, a plurality of conductor patterns 26 provided corresponding to the plurality of piezoelectric substrates 6, and connecting conductors 27 for connecting among adjacent conductor patterns 26 are formed is prepared.

Next, as shown in FIG. 6, a plurality of surface acoustic wave devices 9, the reflector 15, and the conductor removing portion 11 for forming the pattern portion 10 located on the circumference of the large piezoelectric substrate 25 are formed by a photolithography process. When the conductor removing portion 11 is formed in the process of FIG. 6, the inter-electrode removing portion 12, the main removing portions 13a of the shape removing portion 13, and the extending projection portions 14a of the lateral removing portion 14 are formed (worked).

As a result, the connecting portions 28 located between the main removing portions 13a for connecting the pattern portion 10 to the connecting electrodes 8a and 8b or the pattern portion 10 to the interdigitated electrodes 7a and 7b, the connecting portions 29 located between the ends of the main removing portions 13a and the edge 6a of the piezoelectric substrate 6 for connecting the pattern portion 10 to the connecting electrodes 8a and 8b, and the connecting portions 30 located between the ends of the extending projection removing portions 14a and the edge 6a of the piezoelectric substrate 6 for connecting among pattern portions 10 are provided, with the plurality of surface acoustic wave devices 9 connected to the pattern portions 10.

Accordingly, the pattern portion 10 has patterns for preventing pyroelectric breakdown and the surface acoustic wave device 9 has the same potential as the pattern portion 10, thereby preventing the pyroelectric breakdown when the photolithography process is performed.

Next, as shown in FIG. 7, the first and second connecting removing portions 13b and 13c are formed by removing the connecting portions 28 and 29, the surface acoustic wave device 9 remains non-conductive with the pattern portion 10, the end edge removing portions 14b are formed by removing the connecting portions 30, and the pattern portion 10 is separated into a plurality of pattern portions. Thereafter, when the large piezoelectric substrate 25 is cut along the shape of the piezoelectric substrate 6, the piezoelectric substrate 6 is formed, as shown in FIG. 2, to complete the SAW filter.

In addition, the connecting portions 28 and 29 and the connecting portions 30 are removed through the same process.

In addition, in manufacturing the surface acoustic wave devices 9 from the large piezoelectric substrate 25, the surface acoustic wave devices 9 can be manufactured while large piezoelectric substrates 25 are fed in order, or the surface acoustic wave devices 9 can be manufactured at once through the same process or can be separately manufactured through separate processes on the large piezoelectric substrate 25.

FIG. 8 shows a SAW filter according to a second embodiment of the invention. As shown in FIG. 8, the lateral removing portions 14 connected to the shape removing portions 13 are formed at the connecting electrode 8a side of second surface acoustic wave device 9b and the connecting electrode 8b side of third surface acoustic wave device 9c, with both electrodes 8a and 8b isolated from each other, at both ends of the second and third surface acoustic wave devices 9b and 9c, and each of the pattern portions 10 located at both sides of the surface acoustic wave devices 9 is separated into three pattern portions.

Except the above-described configuration, the second embodiment has the same configuration as the first embodiment. Therefore, in the second embodiment, the same elements as the first embodiment are denoted by the same reference numerals, and explanation thereof will be omitted.

In addition, in the second embodiment, the lateral removing portions 14 can be formed at both ends of one of the second surface acoustic wave device 9b and the third surface acoustic wave device 9c, or the lateral removing portions 14 can be formed at one end of one of the second and third surface acoustic wave device 9b and 9c and the other end of the one of the second and third surface acoustic wave device 9b and 9c.

FIG. 9 shows a SAW filter according to a third embodiment of the invention. As shown in FIG. 9, at both ends of the second and third surface acoustic wave devices 9b and 9c, the lateral removing portions 14 connected to the shape removing portions 13 are formed at the connecting electrode 8a side of the second surface acoustic wave device 9b, at the connecting electrode 8b side of the third surface acoustic wave device 9c, with both electrodes 8a and 8b isolated from each other, and between the second and third surface acoustic wave devices 9b and 9c connected to each other, and each of the pattern portions 10 located at both sides of the surface acoustic wave devices 9 is separated into four pattern portions.

Except the above-described configuration, the third embodiment has the same configuration as the first embodiment. Therefore, in the third embodiment, the same elements as the first embodiment are denoted by the same reference numerals, and explanation thereof will be omitted.

The invention claimed is:

1. A SAW filter comprising:
a piezoelectric substrate, and
a plurality of surface acoustic wave devices formed on one side of the piezoelectric substrate, each including a pair of opposite interdigitated electrodes formed by conductors and connecting electrodes formed by conductors and connected respectively to the interdigitated electrodes,
wherein pattern portions formed by conductors provided on circumferences of the plurality of surface acoustic wave devices and conductor removing portions provided between the surface acoustic wave devices and the pattern portions are formed on the one side of the piezoelectric substrate, and
wherein the shape of the surface acoustic wave devices is formed by the conductor removing portions, and the surface acoustic wave devices remain non-conductive with the pattern portions by the conductor removing portions; each of the conductor removing portions includes a shape removing portion for forming the shape of the surface acoustic wave devices and a lateral removing portion connected to the shape removing portion from a periphery including boundaries between the interdigitated electrodes and the connecting electrodes at both ends of one of the surface acoustic wave devices, the lateral removing portion extending toward a side edge of the piezoelectric substrate, and the pattern portion located at both sides of the surface acoustic wave device is separated into two portions by the lateral removing portion; and
wherein the SAW filter is composed of a ladder filter in which the plurality of surface acoustic wave devices is connected in series to one another and a plurality of other surface acoustic wave devices is connected in parallel with respect to the plurality of surface acoustic wave devices connected in series, and the lateral removing portion is provided at both ends of at least one of the plurality of surface acoustic wave devices connected in series.

2. The SAW filter according to claim 1,
wherein the conductor removing portions are formed by narrow conductor grooves, and the pattern portions are formed around a rough entire shape of the SAW devices on one side of the piezoelectric substrate, except for the surface acoustic wave devices and the conductor removing portions.

3. The SAW filter according to claim 1,
wherein the lateral removing portion includes an extending projection removing portion connected to the shape removing portion, which does not reach the side edge of the piezoelectric substrate, and an end edge removing portion formed by removing the pattern portion located between an end of the extending projection removing portion and the end edge of the piezoelectric substrate to have a width narrower than the extending projection removing portion.

4. The SAW filter according to claim 1,
wherein the shape removing portion includes main removing portions formed with a predetermined gap on a rough entire shape of the surface acoustic wave device, first connecting removing portions located between the main removing portions and having connecting portions connecting the pattern portion to the connecting electrodes or the pattern portion to the interdigitated electrodes, with the connecting portions narrower than the main removing portions, and second connecting removing portions located between ends of the main removing portions and the side edge of the piezoelectric substrate and having connecting portions connecting the pattern portion to the connecting electrodes, with the connecting portions narrower than the main removing portions.

5. The SAW filter according to claim 1,
wherein a reflector is provided in the pattern portion arranged at both sides of each of the surface acoustic wave devices.

6. A SAW filter comprising:
a piezoelectric substrate, and
a plurality of surface acoustic wave devices formed on one side of the piezoelectric substrate, each including a pair of opposite interdigitated electrodes formed by conductors and connecting electrodes formed by conductors and connected respectively to the interdigitated electrodes,
wherein pattern portions formed by conductors provided on circumferences of the plurality of surface acoustic wave devices and conductor removing portions provided between the surface acoustic wave devices and the pattern portions are formed on the one side of the piezoelectric substrate, and
wherein the shape of the surface acoustic wave devices is formed by the conductor removing portions, and the surface acoustic wave devices remain non-conductive with the pattern portions by the conductor removing portions; and
wherein two of the surface acoustic wave devices are arranged adjacent and opposite to each other, the interdigitated electrodes of one of the two surface acoustic wave devices are connected to each other by the connecting electrodes, each of the conductor removing portions includes a shape removing portion for forming the shape of the surface acoustic wave devices and four lateral removing portions connected to the shape removing portion from a periphery including boundaries between interdigitated electrodes, which are not connected to each other, of the other of the two surface acoustic wave devices and the connecting electrodes connected to the interdigitated electrodes which are not connected to each other, at both ends of the two surface acoustic wave devices, the four lateral removing portions extending toward a side edge of the piezoelectric substrate, and each of the pattern portions located at both sides of the surface acoustic wave device is separated into three portions by the lateral removing portion.

7. A SAW filter comprising:
a piezoelectric substrate, and
a plurality of surface acoustic wave devices formed on one side of the piezoelectric substrate, each including a pair of opposite interdigitated electrodes formed by conductors and connecting electrodes formed by conductors and connected respectively to the interdigitated electrodes,
wherein pattern portions formed by conductors provided on circumferences of the plurality of surface acoustic wave devices and conductor removing portions provided between the surface acoustic wave devices and the pattern portions are formed on the one side of the piezoelectric substrate, and wherein the shape of the surface acoustic wave devices is formed by the conductor removing portions, and the surface acoustic wave devices remain non-conductive with the pattern portions by the conductor removing portions;

wherein two of the surface acoustic wave devices are arranged adjacent and opposite to each other, the interdigitated electrodes of one of the two surface acoustic wave devices are connected to each other by the connecting electrodes, each of the conductor removing portions includes a shape removing portion for forming the shape of the surface acoustic wave devices and a lateral removing portion connected to the shape removing portion from a periphery including boundaries between the interdigitated electrodes and the connecting electrodes, at both ends of the two surface acoustic wave devices, the lateral removing portion extending toward a side edge of the piezoelectric substrate, and the pattern portion located at both sides of the surface acoustic wave device is separated into two portions by the lateral removing portion; and wherein the lateral removing portion connected to the shape removing portion from the periphery including boundaries between interdigitated electrodes, which are not connected to each other, of the other of the two surface acoustic wave devices and the connecting electrodes connected to the interdigitated electrodes which are not connected to each other, the lateral removing portion extending toward a side edge of the piezoelectric substrate, is provided at both, any, or one end of the two surface acoustic wave devices, and the pattern portion located at both sides of the surface acoustic wave device is separated into three or four portions by the lateral removing portion.

* * * * *

UNITED STATES PATENT AND TRADEMARK OFFICE
CERTIFICATE OF CORRECTION

PATENT NO. : 7,498,905 B2  Page 1 of 1
APPLICATION NO. : 11/204119
DATED : March 3, 2009
INVENTOR(S) : Kudo et al.

It is certified that error appears in the above-identified patent and that said Letters Patent is hereby corrected as shown below:

On the title page,

[*] Notice: Subject to any disclaimer, the term of this patent is extended or adjusted under 35 USC 154(b) by 522 days Delete the phrase "by 522 days" and insert -- by 722 days --

Signed and Sealed this

Thirtieth Day of March, 2010

David J. Kappos
*Director of the United States Patent and Trademark Office*